(12) United States Patent
Peng et al.

(10) Patent No.: US 12,219,880 B2
(45) Date of Patent: Feb. 4, 2025

(54) INTEGRATED CIRCUIT DEVICE

(71) Applicant: TAIWAN SEMICONDUCTOR MANUFACTURING CO., LTD., Hsinchu (TW)

(72) Inventors: Tai-Yen Peng, Hsinchu (TW); Hui-Hsien Wei, Taoyuan (TW); Wei-Chih Wen, Hsinchu County (TW); Pin-Ren Dai, Hsinchu County (TW); Chien-Min Lee, Hsinchu County (TW); Sheng-Chih Lai, Hsinchu County (TW); Han-Ting Tsai, Kaohsiung (TW); Chung-Te Lin, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/595,256

(22) Filed: Mar. 4, 2024

(65) Prior Publication Data
US 2024/0206344 A1    Jun. 20, 2024

Related U.S. Application Data

(63) Continuation of application No. 18/312,372, filed on May 4, 2023, now Pat. No. 12,069,958, which is a
(Continued)

(51) Int. Cl.
*H10N 50/01* (2023.01)
*G11C 11/16* (2006.01)
(Continued)

(52) U.S. Cl.
CPC ........... *H10N 50/01* (2023.02); *G11C 11/161* (2013.01); *H10B 61/20* (2023.02); *H10N 50/10* (2023.02); *H10N 50/80* (2023.02)

(58) Field of Classification Search
CPC ....... H01L 27/226; H01L 43/12; H01L 43/08; H01L 43/02; H01L 27/228; H01L 45/08; H01L 45/1675; H01L 45/146; H01L 45/1233; H01L 45/04; H01L 43/10; H01L 45/1608; H01L 27/222; H01L 27/24; H01L 27/2436; H01L 45/1253; H01L 45/16; H01L 23/528; H01L 21/76802; H01L 21/76877; H01L 23/5226; H01L 21/76807; H01L 23/53295; H01L 27/105; H01L 2924/15311; H01L 2224/73253; H01L 2224/16225; H01L 2924/16152;
(Continued)

(56) References Cited

U.S. PATENT DOCUMENTS 6,091,081 A    7/2000 Matsubara
6,593,632 B1   7/2003 Avanzino
(Continued)

*Primary Examiner* — Mouloucoulaye Inoussa
(74) *Attorney, Agent, or Firm* — Maschoff Brennan

(57) ABSTRACT

A memory device includes a bottom electrode contact, a magnetic tunnel junction pattern, a protection insulating layer, a first capping layer, an interlayer insulating layer, and a second capping layer. The magnetic tunnel junction pattern is over the bottom electrode contact. The protection insulating layer surrounds the magnetic tunnel junction pattern. The first capping layer surrounds the protection insulating layer. The interlayer insulating layer surrounds the first capping layer. The second capping layer is over the first capping layer and the interlayer insulating layer.

20 Claims, 17 Drawing Sheets

Related U.S. Application Data continuation of application No. 17/221,674, filed on Apr. 2, 2021, now Pat. No. 11,683,988, which is a continuation of application No. 16/866,101, filed on May 4, 2020, now Pat. No. 10,971,682, which is a continuation of application No. 15/828,101, filed on Nov. 30, 2017, now Pat. No. 10,644,231.

(51) Int. Cl.
  *H10B 61/00* (2023.01)
  *H10N 50/10* (2023.01)
  *H10N 50/80* (2023.01)

(58) Field of Classification Search
  CPC ... H01L 2224/73204; H01L 2924/0002; G11C 11/161; G11C 11/5607; G11C 11/165; G11C 11/1675
  See application file for complete search history.

(56) References Cited

U.S. PATENT DOCUMENTS

| | | |
|---|---|---|
| 9,142,762 B1 | 9/2015 | Li et al. |
| 9,502,466 B1 | 11/2016 | Chuang |
| 9,859,335 B1 | 1/2018 | Hsu et al. |
| 9,893,278 B1 | 2/2018 | Chuang |
| 9,954,166 B1 | 4/2018 | Lin et al. |
| 2009/0039451 A1 | 2/2009 | Ueno et al. |
| 2011/0031538 A1 | 2/2011 | Hseih |
| 2011/0111532 A1 | 5/2011 | Ryu et al. |
| 2011/0121417 A1 | 5/2011 | Li et al. |
| 2012/0032287 A1 | 2/2012 | Li et al. |
| 2013/0032775 A1 | 2/2013 | Satoh |
| 2013/0119494 A1 | 5/2013 | Li et al. |
| 2013/0171743 A1 | 7/2013 | Lee et al. |
| 2013/0235656 A1 | 9/2013 | Li et al. |
| 2014/0210103 A1 | 7/2014 | Satoh et al. |
| 2015/0171314 A1 | 6/2015 | Li et al. |
| 2015/0325600 A1 | 11/2015 | Sakata et al. |
| 2016/0093668 A1 | 3/2016 | Lu et al. |
| 2016/0218283 A1 | 7/2016 | Trinh et al. |
| 2016/0225979 A1 | 8/2016 | Hsu et al. |
| 2016/0268499 A1 | 9/2016 | You |
| 2016/0308119 A1 | 10/2016 | Hsu et al. |
| 2016/0351792 A1 | 12/2016 | Jiang et al. |
| 2016/0365505 A1 | 12/2016 | Lu et al. |
| 2016/0380183 A1 | 12/2016 | Chuang et al. |
| 2017/0047574 A1 | 2/2017 | Fees et al. |
| 2017/0069832 A1 | 3/2017 | Kim et al. |
| 2017/0084820 A1 | 3/2017 | Tan et al. |
| 2017/0092847 A1 | 3/2017 | Kim et al. |
| 2017/0110653 A1 | 4/2017 | Seo et al. |
| 2017/0117467 A1 | 4/2017 | Chang et al. |
| 2017/0148849 A1 | 5/2017 | Chuang et al. |
| 2017/0194557 A1 | 7/2017 | Chuang |
| 2017/0222128 A1 | 8/2017 | Sung et al. |
| 2017/0301728 A1 | 10/2017 | Chuang et al. |
| 2017/0358740 A1 | 12/2017 | Lee et al. |
| 2018/0006085 A1 | 1/2018 | Chuang et al. |
| 2018/0040668 A1 | 2/2018 | Park et al. |
| 2018/0040817 A1 | 2/2018 | Chuang et al. |
| 2018/0041813 A1 | 2/2018 | Wood |
| 2018/0097173 A1 | 4/2018 | Chuang et al. |
| 2018/0158728 A1 | 6/2018 | Chu et al. |
| 2018/0182810 A1 | 6/2018 | Yi et al. |
| 2018/0198059 A1 | 7/2018 | Ko et al. |
| 2018/0301505 A1 | 10/2018 | Chuang et al. |
| 2018/0350875 A1 | 12/2018 | Han et al. |
| 2018/0358546 A1 | 12/2018 | Yi et al. |
| 2019/0067373 A1 | 2/2019 | Yang et al. |
| 2019/0096753 A1 | 3/2019 | Lin et al. |

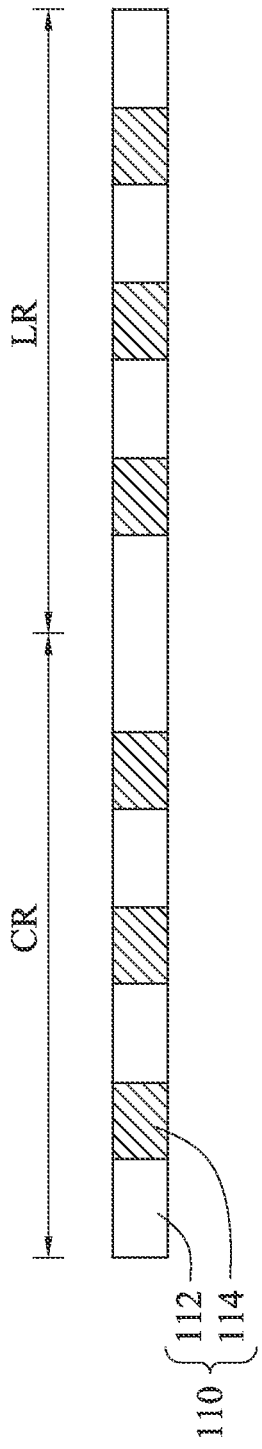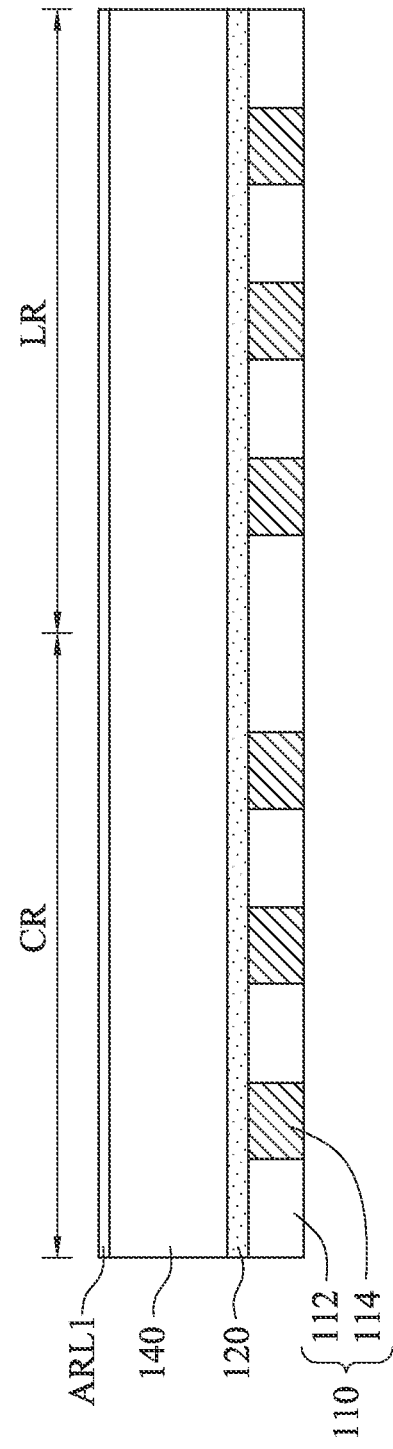

INTEGRATED CIRCUIT DEVICE

PRIORITY CLAIM AND CROSS-REFERENCE

This application is a continuation application of U.S. patent application Ser. No. 18/312,372, filed May 4, 2023, which is a continuation application of U.S. patent application Ser. No. 17/221,674, filed Apr. 2, 2021, now U.S. Pat. No. 11,683,988, issued Jun. 20, 2023, which is a continuation application of U.S. patent application Ser. No. 16/866,101, filed May 4, 2020, now U.S. Pat. No. 10,971,682, issued Apr. 6, 2021, which is a continuation application of U.S. patent application Ser. No. 15/828,101, filed Nov. 30, 2017, now U.S. Pat. No. 10,644,231, issued May 5, 2020, all of which are herein incorporated by reference in their entireties.

BACKGROUND

Semiconductor memories are used in integrated circuits for electronic applications, including radios, televisions, cell phones, and personal computing devices, as examples. One type of semiconductor memory device involves spin electronics, which combines semiconductor technology and magnetic materials and devices. The spins of electrons, through their magnetic moments, rather than the charge of the electrons, are used to indicate a bit.

One such spin electronic device is magnetoresistive random access memory (MRAM) array, which includes conductive lines (word lines and bit lines) positioned in different directions, e.g., perpendicular to each other in different metal layers. The conductive lines sandwich a magnetic tunnel junction (MTJ), which functions as a magnetic memory cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-18 are cross-sectional views of the MRAM device at various intermediate stages of manufacture according to various embodiments of the present disclosure.

DETAILED DESCRIPTION

Figure 3:
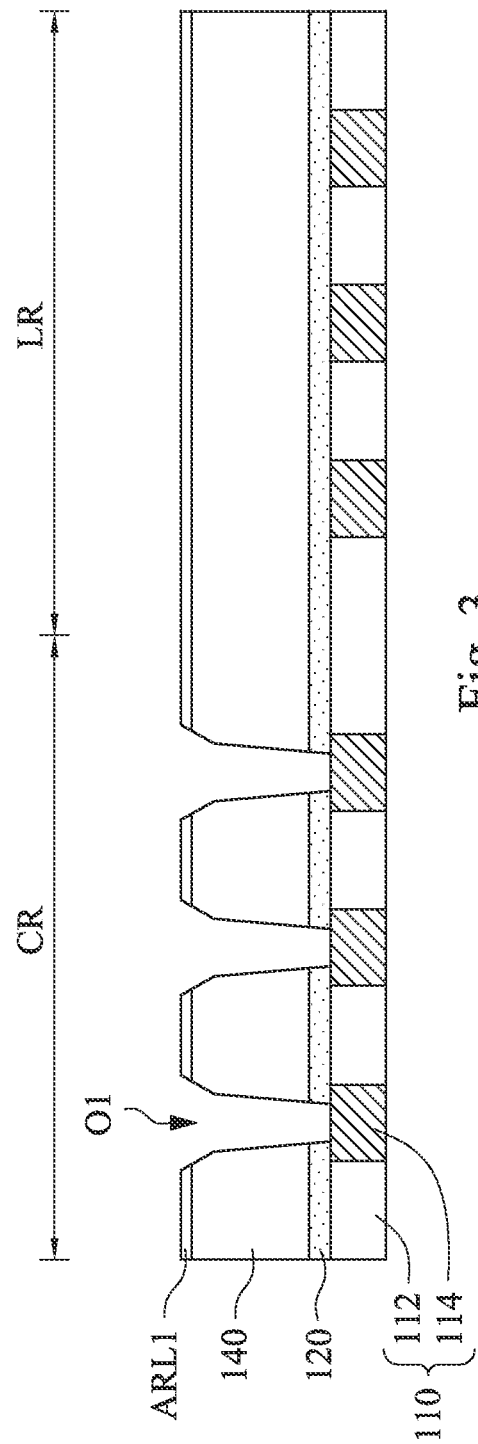

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to some embodiments of this disclosure, a magnetoresistive random access memory (MRAM) device is formed. The MRAM device includes a magnetic tunnel junction (MTJ) stack. The MTJ stack includes a tunnel barrier layer formed between a ferromagnetic pinned layer and a ferromagnetic free layer. The tunnel barrier layer is thin enough (such a few nanometers) to permit electrons to tunnel from one ferromagnetic layer to the other. A resistance of the MTJ stack is adjusted by changing a direction of a magnetic moment of the ferromagnetic free layer with respect to that of the ferromagnetic pinned layer. When the magnetic moment of the ferromagnetic free layer is parallel to that of the ferromagnetic pinned layer, the resistance of the MTJ stack is in a lower resistive state, corresponding to a digital signal "0". When the magnetic moment of the ferromagnetic free layer is anti-parallel to that of the ferromagnetic pinned layer, the resistance of the MTJ stack is in a higher resistive state, corresponding to a digital signal "1". The MTJ stack is coupled between top and bottom electrode and an electric current flowing through the MTJ stack (tunneling through the tunnel barrier layer) from one electrode to the other is detected to determine the resistance and the digital signal state of the MTJ stack.

According to some embodiments of this disclosure, the MRAM device is formed within a chip region of a substrate. A plurality of semiconductor chip regions is marked on the substrate by scribe lines between the chip regions. The substrate will go through a variety of cleaning, layering, patterning, etching and doping steps to form the MRAM devices. The term "substrate" herein generally refers to a bulk substrate on which various layers and device elements are formed. In some embodiments, the bulk substrate includes silicon or a compound semiconductor, such as GaAs, InP, SiGe, or SiC. Examples of the layers include dielectric layers, doped layers, polysilicon layers or conductive layers. Examples of the device elements include transistors, resistors, and/or capacitors, which may be interconnected through an interconnect layer to additional integrated circuits.

FIG. 1 illustrates a wafer having a substrate 110 thereon. The substrate 110 has a logic region LR where logic circuits are to be formed and a cell region CR where memory devices are to be formed. The substrate 110 includes an interlayer dielectric (ILD) layer or inter-metal dielectric (IMD) layer 112 with a metallization pattern 114 over the logic region LR and the cell region CR. The ILD layer 112 may be silicon oxide, fluorinated silica glass (FSG), carbon doped silicon oxide, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, low-k dielectric material, the like or combinations thereof. The metallization pattern 114 may be aluminum, aluminum alloy, copper, copper alloy, titanium, titanium nitride, tantalum, tantalum nitride, tungsten, cobalt, the like, and/or combinations thereof. Formation of the metallization pattern 114 and the ILD layer 112 may be a dual-damascene process and/or a single-damascene process. The substrate 110 may also include active and passive devices, for example, underlying the ILD layer 112. These further components are omitted from the figures for clarity. In some embodiments, a dielectric layer having a bottom electrode via (BEVA) therein is formed over the substrate, and a bottom electrode (BE) layer is formed over the dielectric layer.

Reference is then made to FIG. 2. An etch stop layer 120 and a dielectric layer 140 are formed over the logic region LR and the cell region CR of the substrate 110 in a sequence. The etch stop layer 120 may have a high etch resistance to one or more subsequent etching processes. The etch stop layer 120 may be formed of dielectric material different from the underlying ILD layer 112. For example, the ILD layer 112 may be a silicon oxide layer, and the etch stop layer 120 may be a silicon nitride layer or a silicon carbide layer.

The dielectric layer 140 in some embodiments is silicon carbide (SiC), silicon oxynitride (SiON), silicon nitride (SiN), silicon dioxide, the like, and/or combinations thereof. The dielectric layer 140 may be a single-layered structure or a multi-layered structure. The dielectric layer 140 may be formed by acceptable deposition techniques, such as chemical vapor deposition (CVD), atomic layer deposition (ALD), physical vapor deposition (PVD), the like, and/or a combination thereof. In some embodiments, an anti-reflection layer ARL1, for example, a nitrogen-free anti-reflection layer (NFARL) is optionally formed over the dielectric layer 140. In some embodiments, a protective layer, such as an aluminum-based layer may be formed between the etch stop layer 120 and the dielectric layer 140.

Reference is then made to FIG. 3. Openings O1 are formed in the anti-reflection layer ARL1, the etch stop layer 120, and the dielectric layer 140 in the cell region CR, and exposes portions of the metallization pattern 114. An exemplary formation method of the openings O1 includes forming a patterned mask may over the anti-reflection layer ARL1, and then etching the anti-reflection layer ARL1, the etch stop layer 120, and the dielectric layer 140 through the patterned mask by one or more etching processes.

Figure 4:
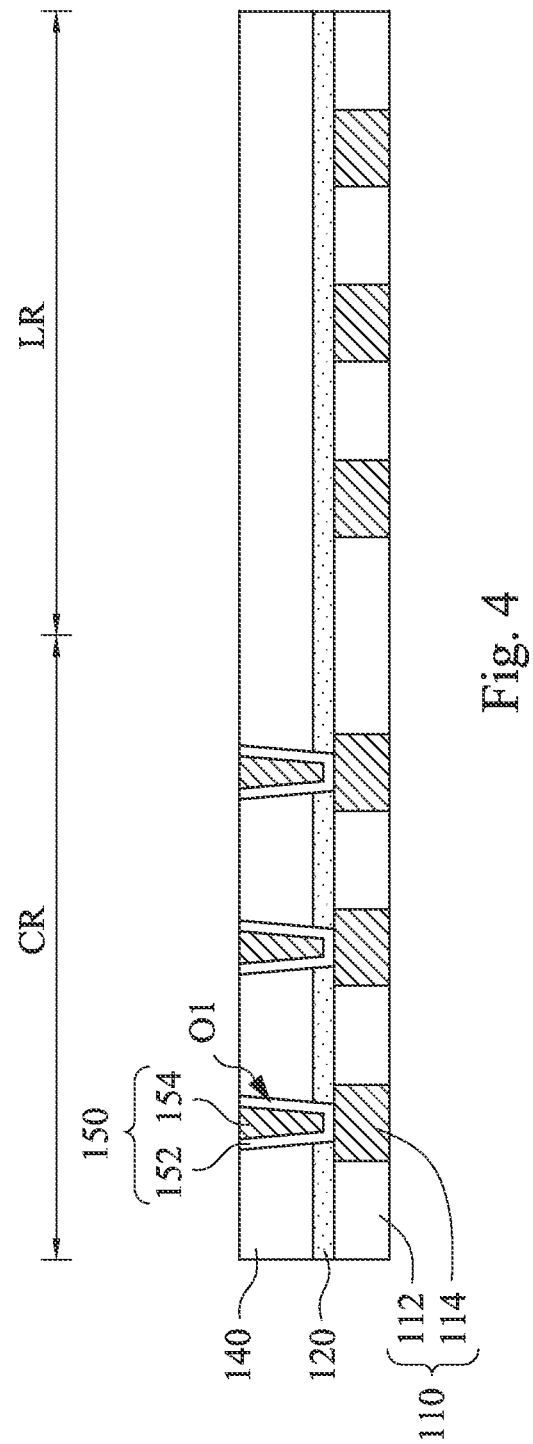

Reference is then made to FIG. 4. Bottom electrode vias (BEVA) 150 are then formed within the openings O1. In some embodiments, at least one of the BEVAs 150 is a multi-layered structure and includes, for example, a diffusion barrier layer 152 and a filling metal 154 filling a recess in the diffusion barrier layer 152. An exemplary formation method of the BEVAs 150 includes forming in sequence the diffusion barrier layer 152 and the filling metal 154 into the openings O1, and performing a planarization process, such as a chemical-mechanical polish (CMP) process, to remove excess materials of the filling metal 154 and of the diffusion barrier layer 152 outside the openings O1. The remaining diffusion barrier layer 152 and the remaining filling metal 154 in the openings O1 can serve as the BEVAs 150. In some embodiments, the BEVAs 150 are electrically connected to an underlying electrical component, such as a transistor, through the metallization pattern 114.

In some embodiments, the diffusion barrier layer 152 is a titanium nitride (TiN) layer or a tantalum nitride (TaN) layer, which can act as a suitable barrier to prevent metal diffusion. Formation of the diffusion barrier layer 152 may be exemplarily performed using CVD, PVD, ALD, the like, and/or a combination thereof. In some embodiments, the filling metal 154 is titanium (Ti), tantalum (Ta), platinum (Pt), ruthenium (Ru), tungsten (W), aluminum (Al), copper (Cu), TiN, TaN, the like, and/or combinations thereof. Formation of the filling metal 154 may be exemplarily performed using CVD, PVD, ALD, the like, and/or a combination thereof.

Figure 5:
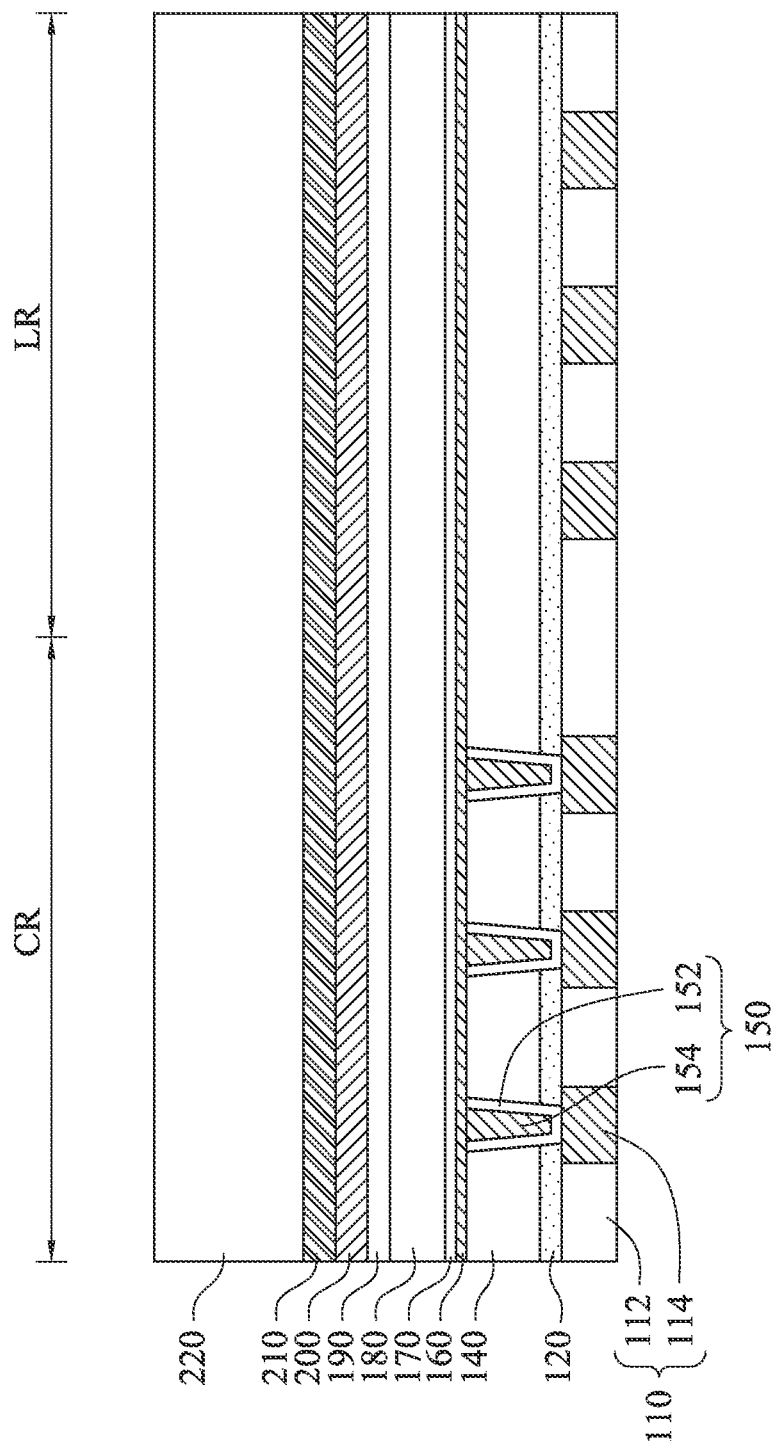

Reference is made to FIG. 5. A blanket bottom electrode layer 160 is then formed over the BEVAs 150 and over the dielectric layer 140, so that the bottom electrode layer 160 extends along top surfaces of the BEVAs 150 and of the dielectric layer 140. The bottom electrode layer 160 can be a single-layered structure or a multi-layered structure. The bottom electrode layer 160 includes a material the same as the filling metal 154 in some embodiments. In some other embodiments, the bottom electrode layer 160 includes a material different from the filling metal 154. In some embodiments, the bottom electrode layer 160 is titanium (Ti), tantalum (Ta), platinum (Pt), ruthenium (Ru), tungsten (W), aluminum (Al), copper (Cu), TiN, TaN, the like, and/or a combination thereof. Formation of the bottom electrode layer 160 may be exemplarily performed using CVD, PVD, ALD, the like, and/or a combination thereof.

In some embodiments, a buffer layer 170 is formed over the bottom electrode layer 160. The buffer layer 170 may include a non-magnetic material. For example, the buffer layer 170 may include tantalum, aluminum, titanium, TiN, TaN, or the combination thereof. The buffer layer 170 may be deposited by PVD, ALD, CVD, or MOCVD (metal-organic chemical vapor deposition). Alternatively, the buffer layer 170 is deposited by an electroless plating process or other suitable process.

A resistance switching layer 180 is formed over the bottom electrode layer 160 and the buffer layer 170. In some embodiments, the resistance switching layer 180 may be a magnetic tunnel junction (MTJ) structure. To be specific, the resistance switching layer 180 includes at least a first magnetic layer, a tunnel barrier layer and a second magnetic layer are formed in sequence over the bottom electrode layer 160 and the buffer layer 170.

In some embodiments, the first magnetic layer includes an anti-ferromagnetic material (AFM) layer over the buffer layer 170 and a ferromagnetic pinned layer over the AFM layer. In the anti-ferromagnetic material (AFM) layer, magnetic moments of atoms (or molecules) align in a regular pattern with magnetic moments of neighboring atoms (or molecules) in opposite directions. A net magnetic moment of the AFM layer is zero. In certain embodiments, the AFM layer includes platinum manganese (PtMn). In some embodiments, the AFM layer includes iridium manganese (IrMn), rhodium manganese (RhMn), iron manganese (FeMn), or OsMn. An exemplary formation method of the AFM layer includes sputtering, PVD, ALD, e-beam or thermal evaporation, or the like.

The ferromagnetic pinned layer in the first magnetic layer forms a permanent magnet and exhibits strong interactions with magnets. A direction of a magnetic moment of the ferromagnetic pinned layer can be pinned by an anti-ferromagnetic material (AFM) layer and is not changed during operation of a resulting resistance switching element (e.g. a MTJ stack) fabricated from the resistance switching layer 180. In certain embodiments, the ferromagnetic pinned layer includes cobalt-iron-boron (CoFeB). In some embodiments, the ferromagnetic pinned layer includes CoFeTa, NiFe, Co, CoFe, CoPt, or the alloy of Ni, Co and Fe. An exemplary formation method of the ferromagnetic pinned layer includes sputtering, PVD, ALD, e-beam or thermal evaporation, or the like. In some embodiments, the ferromagnetic pinned layer includes a multilayer structure.

The tunnel barrier layer is formed over the first magnetic layer. The tunnel barrier layer can also be referred to as a tunneling layer, which is thin enough that electrons are able to tunnel through the tunnel barrier layer when a biasing voltage is applied to a resulting resistance switching element (e.g. a MTJ stack) fabricated from the resistance switching layer 180. In certain embodiments, the tunnel barrier layer includes magnesium oxide (MgO), aluminum oxide ($Al_2O_3$), aluminum nitride (AlN), aluminum oxynitride (AlON), hafnium oxide ($HfO_2$) or zirconium oxide ($ZrO_2$). An exemplary formation method of the tunnel barrier layer 172 includes sputtering, PVD, ALD, e-beam or thermal evaporation, or the like.

The second magnetic layer is formed over the tunnel barrier layer. The second magnetic layer is a ferromagnetic free layer in some embodiments. A direction of a magnetic moment of the second magnetic layer is not pinned because there is no anti-ferromagnetic material in the second magnetic layer. Therefore, the magnetic orientation of this layer is adjustable, thus the layer is referred to as a free layer. In some embodiments, the direction of the magnetic moment of the second magnetic layer is free to rotate parallel or anti-parallel to the pinned direction of the magnetic moment of the ferromagnetic pinned layer in the first magnetic layer. The second magnetic layer may include a ferromagnetic material similar to the material in the ferromagnetic pinned layer in the first magnetic layer. Since the second magnetic layer has no anti-ferromagnetic material while the first magnetic layer has an anti-ferromagnetic material therein, the first and second magnetic layers and have different materials. In certain embodiments, the second magnetic layer includes cobalt, nickel, iron or boron. An exemplary formation method of the second magnetic layer includes sputtering, PVD, ALD, e-beam or thermal evaporation, or the like.

In some embodiments where resistive random access memory (RRAM) cells are to be formed on the wafer, the resistance switching layer 180 may include a RRAM dielectric layer such as metal oxide composite, such as hafnium oxide ($HfO_x$), zirconium oxide ($ZrO_x$), aluminum oxide ($AlO_x$), nickel oxide ($NiO_x$), tantalum oxide ($TaO_x$), or titanium oxide ($TiO_x$) as in its relative high resistance state and a metal such as titanium (Ti), hafnium (Hf), platinum (Pt), ruthenium (Ru), and/or aluminum (Al) as in its relative low resistance state.

Capping layers 190 and 200 are formed over the resistance switching layer 180. The capping layers 190 and 200 may include a thin metal-oxide or metal-nitride layer. The metal in the metal-oxide (or metal-nitride) capping layer includes beryllium (Be), magnesium (Mg), aluminium (Al), titanium (Ti), tungsten (W), germanium (Ge), platinum (Pt) and their alloy. In some embodiments, the thickness of the capping layers 190 and 200 is in a range from about 3 angstroms to about 20 angstroms. The capping layers 190 and 200 may be deposited by PVD, ALD, e-beam or thermal evaparation, or the like.

A top electrode layer 210 is formed over the capping layer 200. The top electrode layer 210 includes a conductive material. In some embodiments, the top electrode layer 210 is similar to the bottom electrode layer 160 in terms of composition. In some embodiments, the top electrode layer 210 comprises titanium (Ti), tantalum (Ta), platinum (Pt), ruthenium (Ru), tungsten (W), aluminum (Al), copper (Cu), TiN, TaN, the like or combinations thereof. An exemplary formation method of the top electrode layer 210 includes sputtering, PVD, ALD, e-beam or thermal evaparation, or the like.

A hard mask layer 220 is formed over the top electrode layer 210 in sequence. The hard mask layer 220 is formed from a dielectric material. For example, the hard mask layer 220 may be silicon carbide (SiC), silicon oxynitride (SiON), silicon nitride (SiN), silicon dioxide ($SiO_2$), ashing removable dielectric (ARD), the like, and/or combinations thereof. In some embodiments, the hard mask layer 220 may be formed from a conductive material. The hard mask layer 220 may be formed by acceptable deposition techniques, such as CVD, ALD, PVD, the like, and/or combinations thereof.

Figure 6:
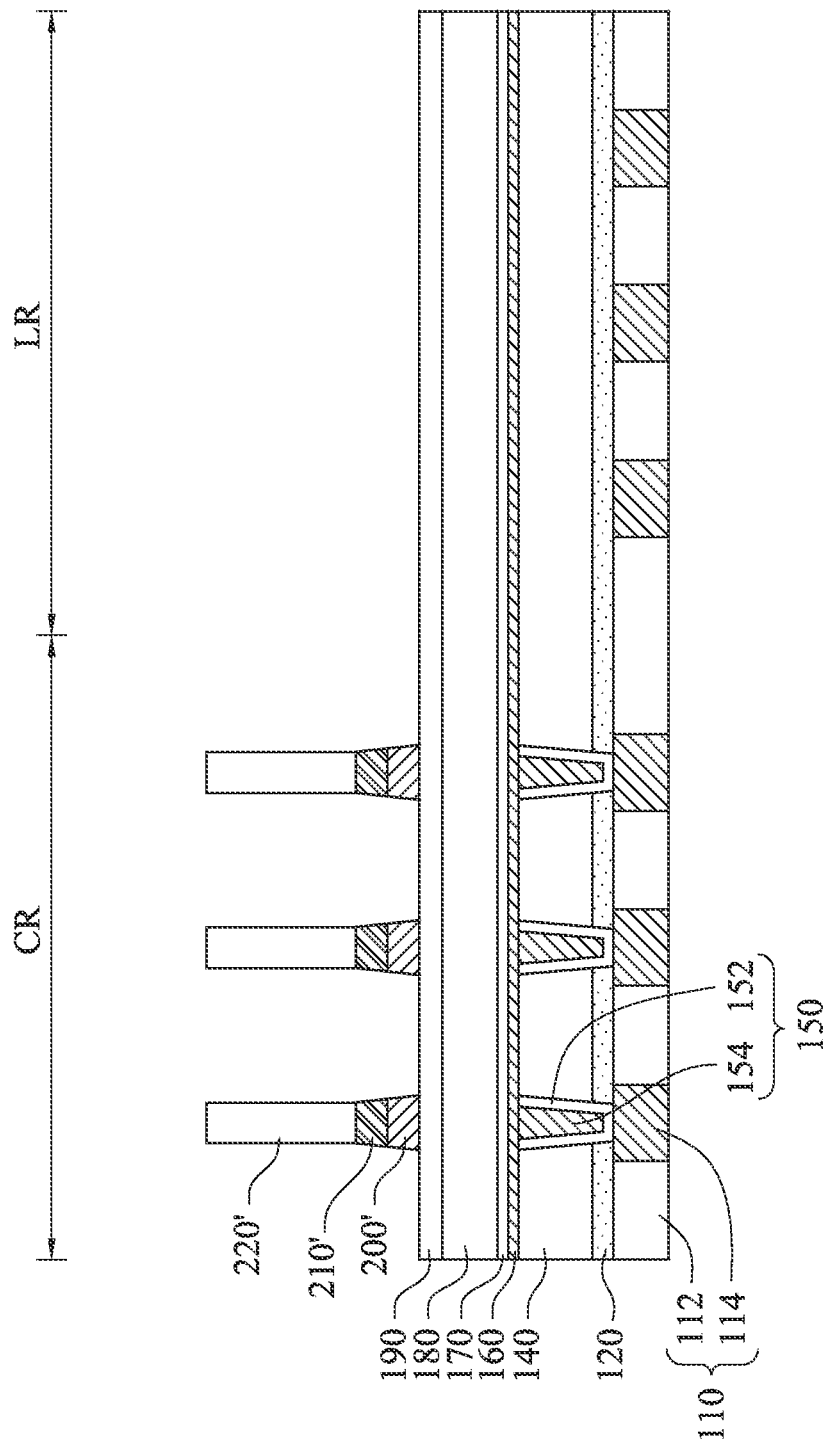

Reference is made to FIG. 6. The hard mask layer 220, underlying top electrode layer 210, and the underlying capping layer 200 are patterned. To be specific, a resist layer (not shown) is formed over the hard mask layer 220 and then patterned into a patterned resist mask using a suitable photolithography process, such that portions of the hard mask layer 220 are exposed by the patterned resist mask. In some embodiments, the patterned resist mask is a photoresist. In some embodiments, the patterned resist mask is an ashing removable dielectric (ARD), which is a photoresist-like material generally having generally the properties of a photoresist and amendable to etching and patterning like a photoresist. An exemplary photolithography process may include photoresist coating (e.g., spin-on coating), soft baking, mask aligning, exposure, post-exposure baking, developing the photoresist, rinsing, drying (e.g., hard baking), other suitable processes, or combinations thereof.

An etching process is performed to remove portions of the hard mask layer 220, underlying top electrode layer 210, and the underlying capping layer 200 not protected by the patterned resist mask. The hard mask layer 220, underlying top electrode layer 210, and the underlying capping layer 200 may be etched using acceptable etching techniques, such as by using an anisotropic etching process. In some embodiments, the capping layer 190 may has a higher etch resistance to the etching process than that of the capping layer 200. After the removal, capping layers 200', top electrodes 210', and hard mask covers 220' remains as shown in FIG. 6. The patterned resist mask is removed using, for example, an ash process, after the etching process.

Figure 7:
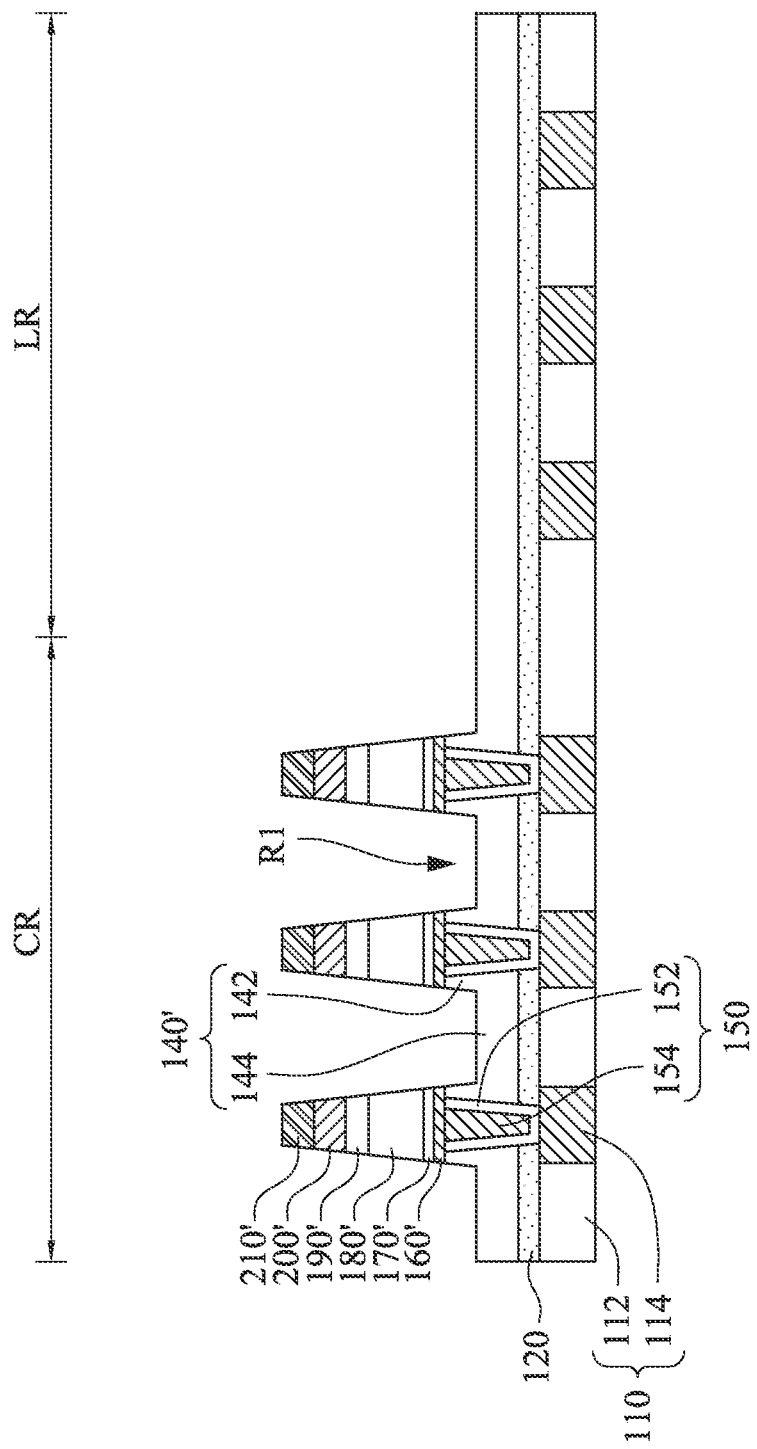

Reference is then made to FIG. 7. An etching process is performed to remove exposed portions of the capping layer 190, underlying resistance switching layer 180, underlying buffer layer 170, and underlying bottom electrode layer 160 not protected by the hard mask covers 220' and the top electrodes 210'. The capping layer 190, the resistance switching layer 180, the underlying buffer layer 170, and the underlying bottom electrode layer 160 may be etched using acceptable etching techniques, such as by using an anisotropic etching process. After the etching process, capping layers 190', resistance switching elements 180', underlying buffers 170', and underlying bottom electrodes 160' remain as shown in FIG. 7. The hard mask covers 220' are removed after the etching process.

In some embodiments, portions of the dielectric layer 140 not protected by the hard mask covers 220' and the top electrodes 210' are also etched, and recesses R1 are formed in the remaining dielectric layer 140'. The remaining dielectric layer 140' includes portions 142 and portions 144. A height of the portions 142 is greater than that of the portion 144. For example, a top end of the portions 142 is higher than that of the portions 144. The portions 142 surround the BEVAs 150 respectively. In some embodiments, a top end of the portions 142 is leveled up with the top surface of the BEVAs 150.

Figure 8:
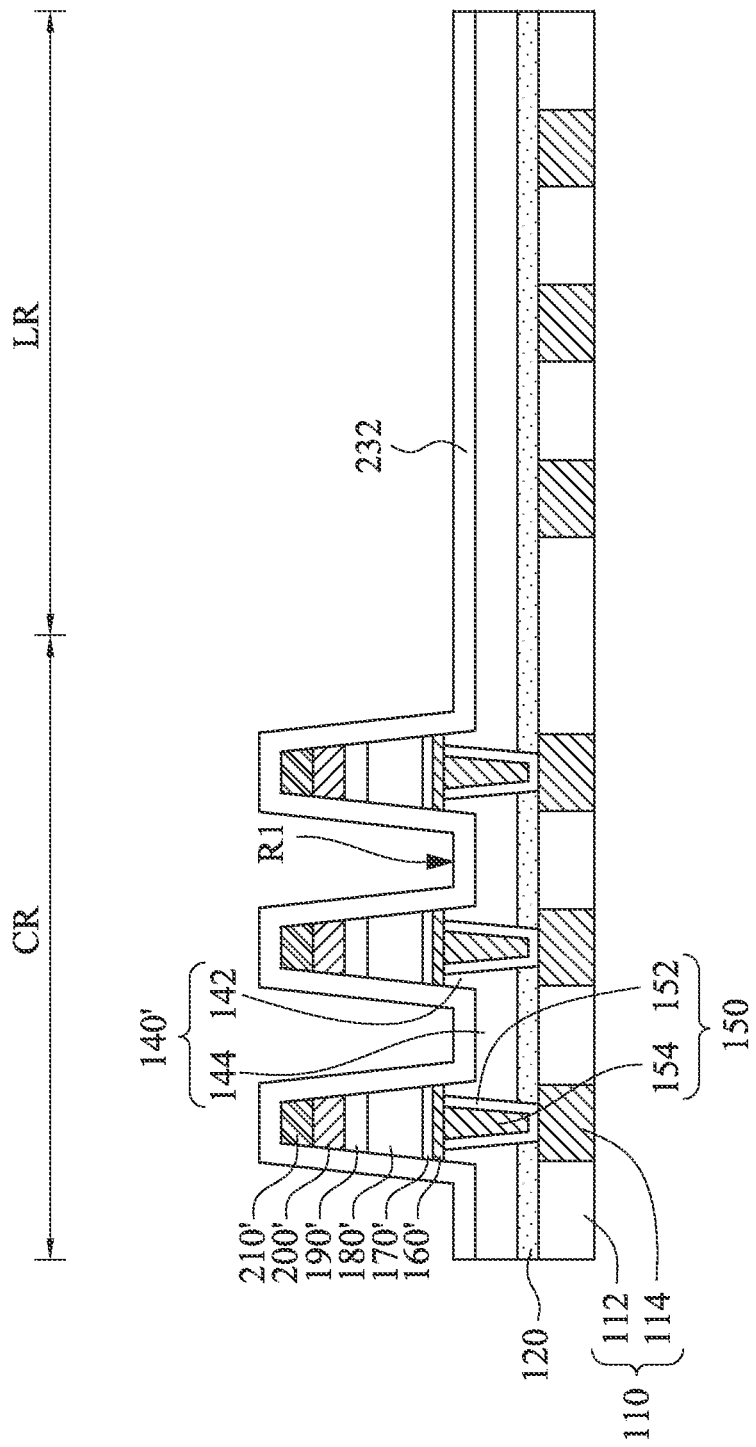

Reference is then made to FIG. 8. A first spacer layer 232 is blanket formed over the top electrodes 210' and over sidewalls of the resistance switching elements 180'. Material of the first spacer layer 232 may be selected to protect the resistance switching elements 180' without influencing the function of the resistance switching elements 180'. For example, the first spacer layer 232 may include suitable dielectric materials such as silicon nitride, silicon carbide, carbon-doped silicon nitride, carbon-doped silicon oxide, silicon oxynitride, other suitable materials, and combinations thereof. In some embodiments, the first spacer layer 232 may also be a composite layer including two or more layers made of different materials, such as a silicon nitride/silicon carbide stack. The first spacer layer 232 may be formed using CVD, PVD, ALD, the like, and/or combinations thereof.

Figure 9:
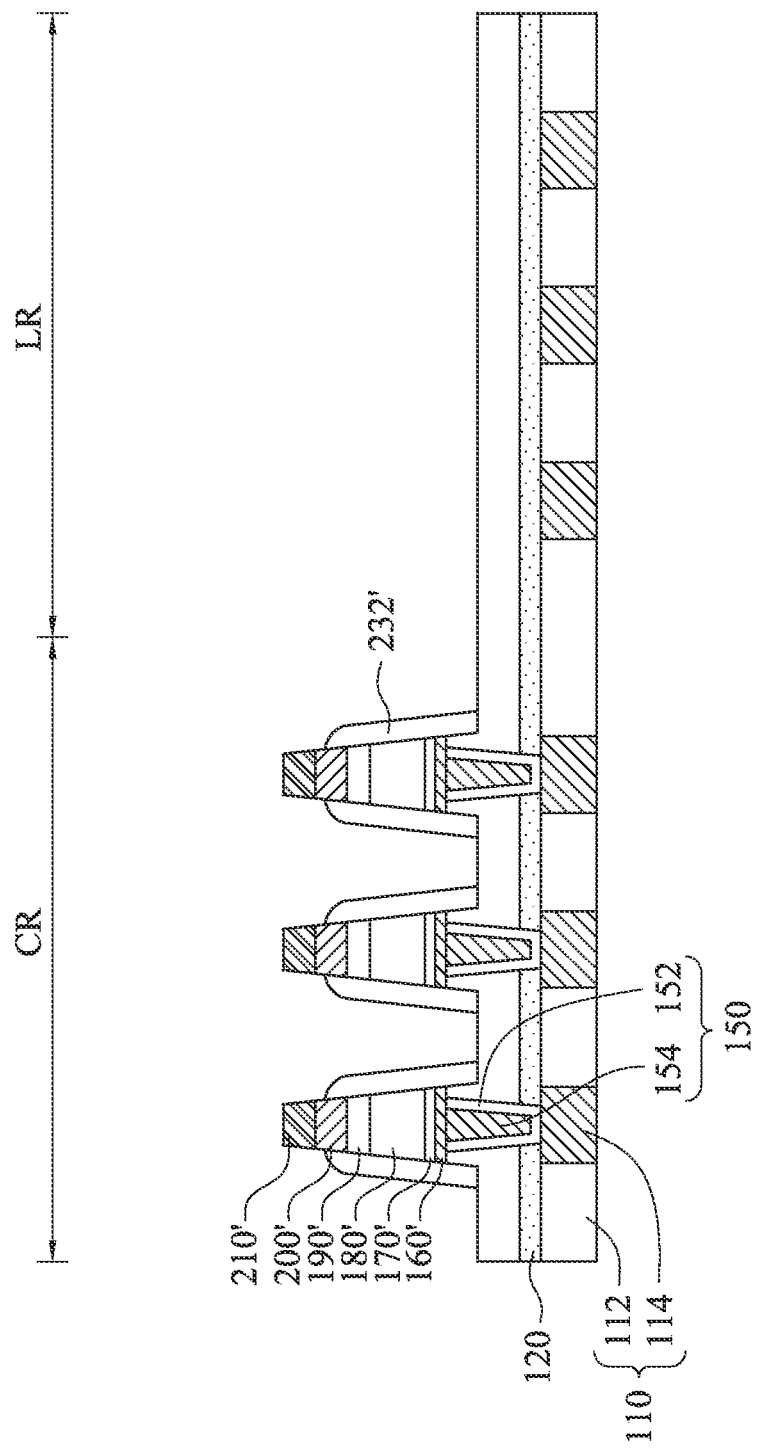

FIG. 9 illustrates patterning of the first spacer layer 232. The patterning process removes horizontal portions of the first spacer layer 232 while remaining vertical portions of the first spacer layer 232 around the resistance switching elements 180'. The remaining portions of the first spacer layer 232 can be referred to as spacers 232'. In some embodiments, the spacers 232' cover sidewalls of the resistance switching elements 180' and leave the top electrodes 210', portions of the capping layers 200', and portions of the dielectric layer 140 uncovered. In some embodiments, the patterning of the first spacer layer 232 may include an etching process, such as an anisotropic etching process using acceptable photolithography techniques. The patterning process may be dry etching, wet etching, or a combination thereof. In some embodiments where the first spacer layer 232 is silicon nitride, the patterning of the silicon nitride layer includes a dry etching using $CH_2F_2$, $CF_4$, $CH_xF_y$, $CHF_3$, $CH_4$, $N_2$, $O_2$, Ar, He, as an etchant, although other applicable etchants may be used.

Figure 10:
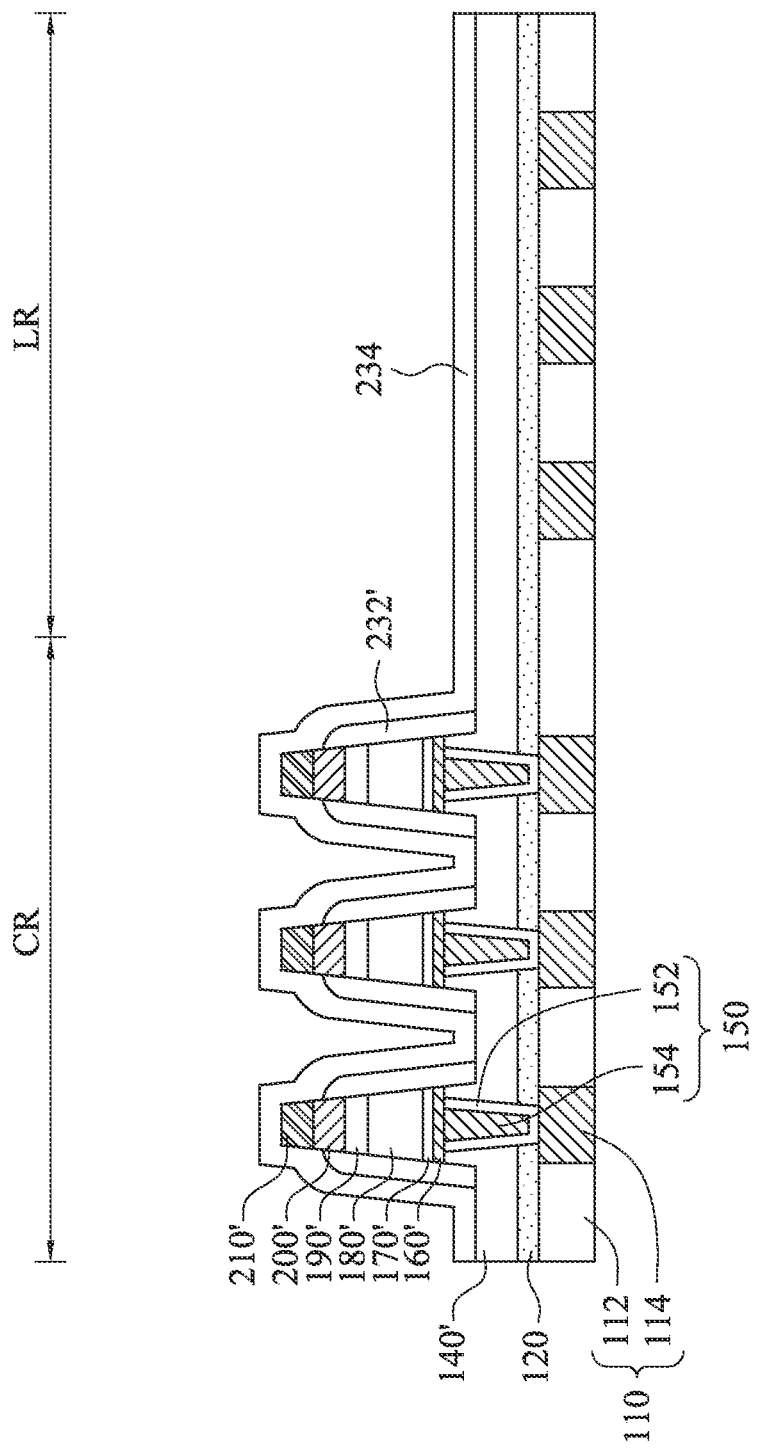

Reference is then made to FIG. 10. A second spacer layer 234 is blanket formed over the spacers 232'. The spacers 232' may separate the resistance switching elements 180' from the second spacer layer 234. Since the resistance switching elements 180' is encapsulated by the spacers 232', it is less likely that the second spacer layer 234 influences the function of the resistance switching elements 180', and therefore the second spacer layer 234 may include a wider range of material than that of the first spacer layer 232. For example, the second spacer layer 234 includes suitable dielectric materials such as silicon nitride, silicon oxide, silicon carbide, carbon-doped silicon nitride, carbon-doped silicon oxide, silicon oxynitride, and combinations thereof. The second spacer layer 234 may be made of the same material as that of the spacers 232'. The second spacer layer 234 may be formed using CVD, PVD, ALD, the like, and/or combinations thereof. In some embodiments, a density of the second spacer layer 234 is greater than a density of the spacer 232'. For example, in some embodiments the first spacer layer 232 and the second spacer layer 234 are made of the same material, the first spacer layer 232 is formed at a first temperature, the second spacer layer 234 is formed at a second temperature higher than the first temperature. In some embodiments, the second spacer layer 234 may also be a composite layer including two or more layers made of different materials, such as a silicon nitride/silicon carbide stack.

Figure 11:
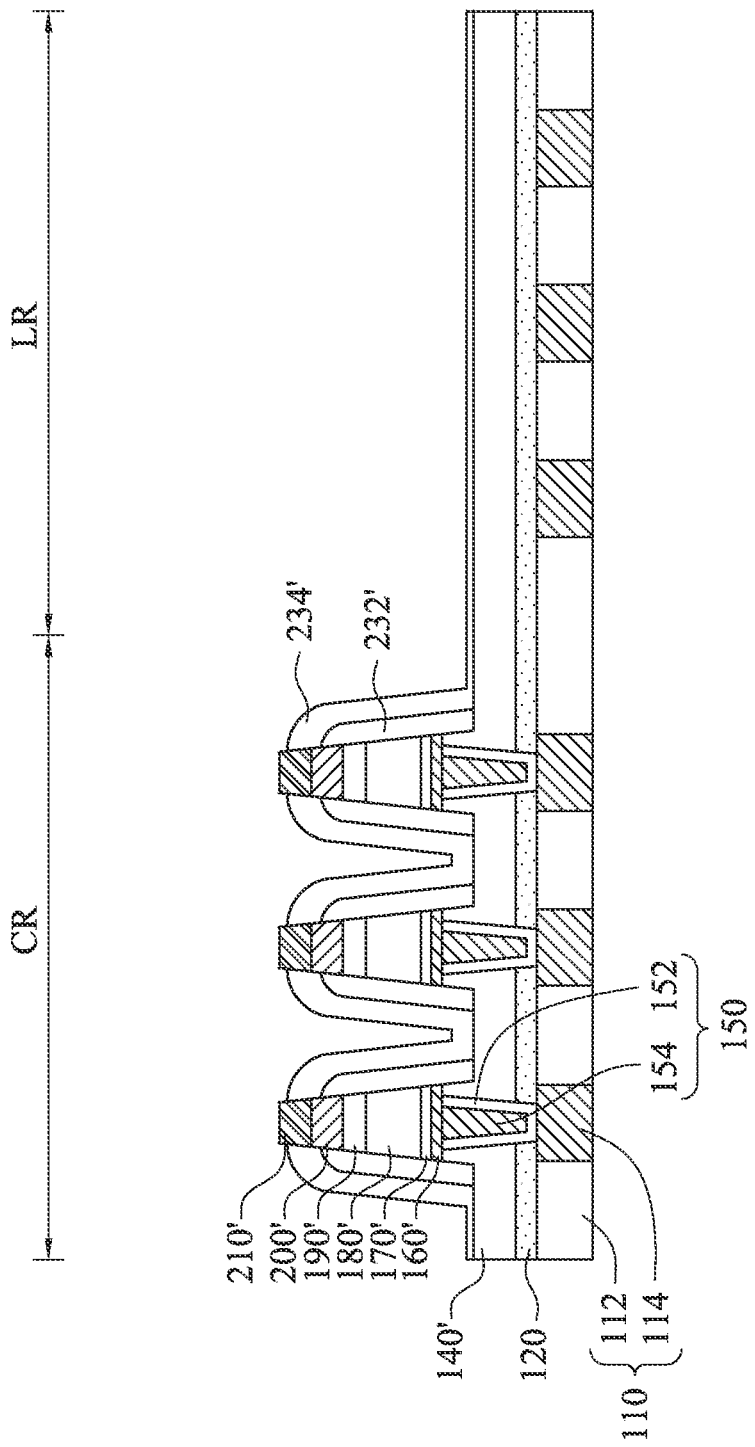

FIG. 11 illustrates patterning of the second spacer layer 234. The patterning process removes horizontal portions of the second spacer layer 234 while remaining portions of the second spacer layer 234 around the resistance switching elements 180' and the spacers 232'. The remaining portions of the second spacer layer 234 can be referred to as spacers 234'. The spacers 234' surrounds the spacers 232'. In some embodiments, the spacers 234' cover sidewalls of the resistance switching elements 180' and sidewalls of the capping layers 200' and expose the top electrodes 210'. In some embodiments, the spacers 234' around the resistance switching elements 180' are connected. In some embodiments, the spacers 234' are separated due to the patterning process.

In some embodiments, the patterning of the second spacer layer 234 may include an etching process, such as an anisotropic etching using acceptable photolithography techniques. The patterning process may be dry etching, wet etching, or a combination thereof. In some embodiments where the second spacer layer 234 is silicon nitride, the patterning of the silicon nitride layer includes a dry etching using $CH_2F_2$ as an etchant, although other applicable etchants may be used.

In some embodiments, the etching process to the second spacer layer 234 may be stopped before reaching the dielectric layer 140, and therefore a thin film of the spacers 234' leaves over a top surface of the dielectric layer 140. For example, the spacers 234' have a thin film over the top surface of the dielectric layer 140 in the logic region LR. In some other embodiments, the dielectric layer 140 may have a higher etch resistance to the etching process than that of the second spacer layer 234, such that the etching process to the second spacer layer 234 may stop at the top surface of the dielectric layer 140, and leaves no thin film of the spacers 234' over the top surface of the dielectric layer 140.

Figure 12:
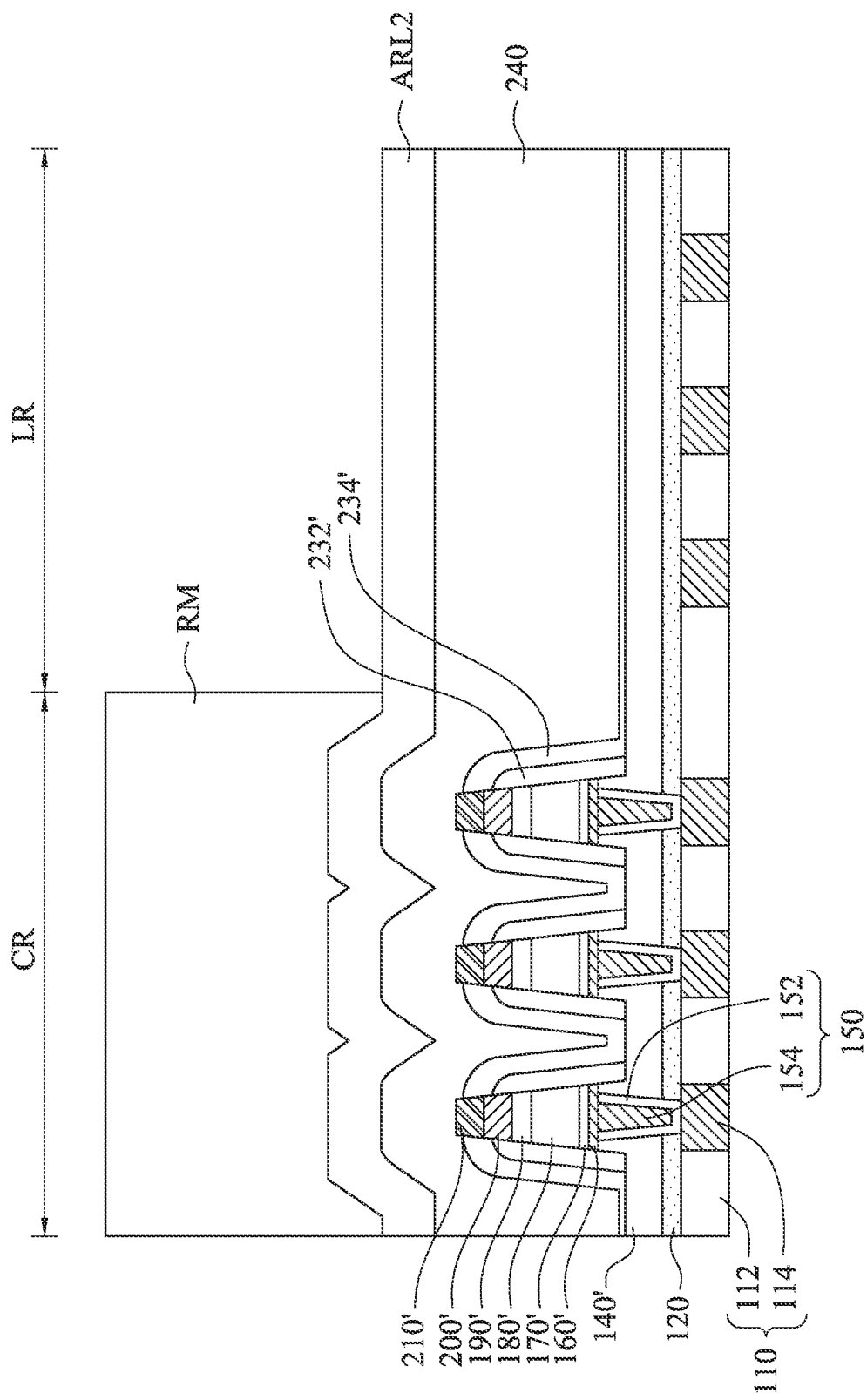

Reference is then made to FIG. 12. Another ILD layer 240 is formed over the substrate 110. In some embodiments, the ILD layer 240 may have the same material as the ILD layer 112. In some other embodiments, the ILD layer 240 may have a different material than the ILD layer 112. In some embodiments, the ILD layer 240 includes silicon oxide, fluorinated silica glass (FSG), carbon doped silicon oxide, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, low-k dielectric material, the like or combinations thereof. An anti-reflection layer ARL2, for example, a nitrogen-free anti-reflection layer (NFARL) is optionally formed over the ILD layer 240. In some embodiments, the spacer 234' may separate the spacer 232' and the resistance switching elements 180' from the ILD layer 240.

Herein, a resist mask RM is formed over the ILD layer 240 and the anti-reflection layer ARL2. The resist mask RM is forming by patterning a resist layer (e.g., a photoresist layer) using a suitable photolithography process. The resist mask RM covers the cell region CR and exposes the logic region LR.

Figure 13:
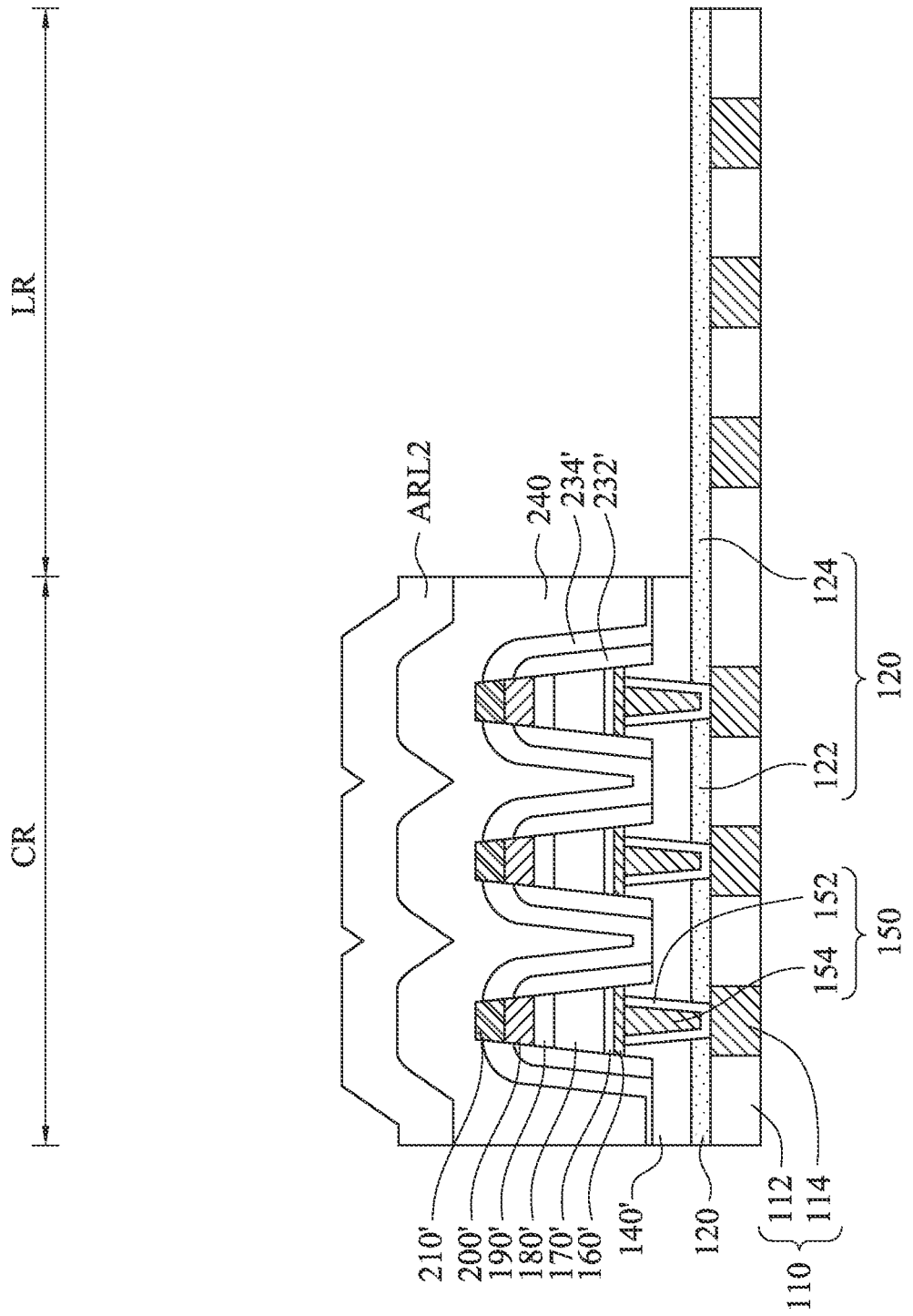

Reference is made to FIG. 13. Portions of the anti-reflection layer ARL2, the ILD layer 240, and the dielectric layer 140 in the logic region LR are removed. The removal may be performed by an etching process. In some embodiments where the ILD layer 240 is silicon oxide, the etchant used in the etching process can be dilute hydrofluoric acid (HF), HF vapor, $CF_4$, $C4F_8$, $CH_xF_y$, $C_xF_y$, $SF_6$, or $NF_3$, Ar, $N_2$, $O_2$, He, gas. The resist mask RM acts as an etching mask during the etching process, and the elements in the cell region CR are protected from being etched by the resist layer RM. The etch stop layer 120 has a higher etch resistance to the etching process than that of the ILD layer 240, such that the etching process in the logic region LR stops at the etch stop layer 120. After the etching process, the anti-reflection layer ARL2, the ILD layer 240, and the dielectric layer 140 are not in the logic region LR. Herein, the etch stop layer 120 has a first portion 122 in the cell region CR and a second portion 124 in the logic region LR, and after the removal, the second portion 124 of the etch stop layer 120 is exposed.

Figure 14:
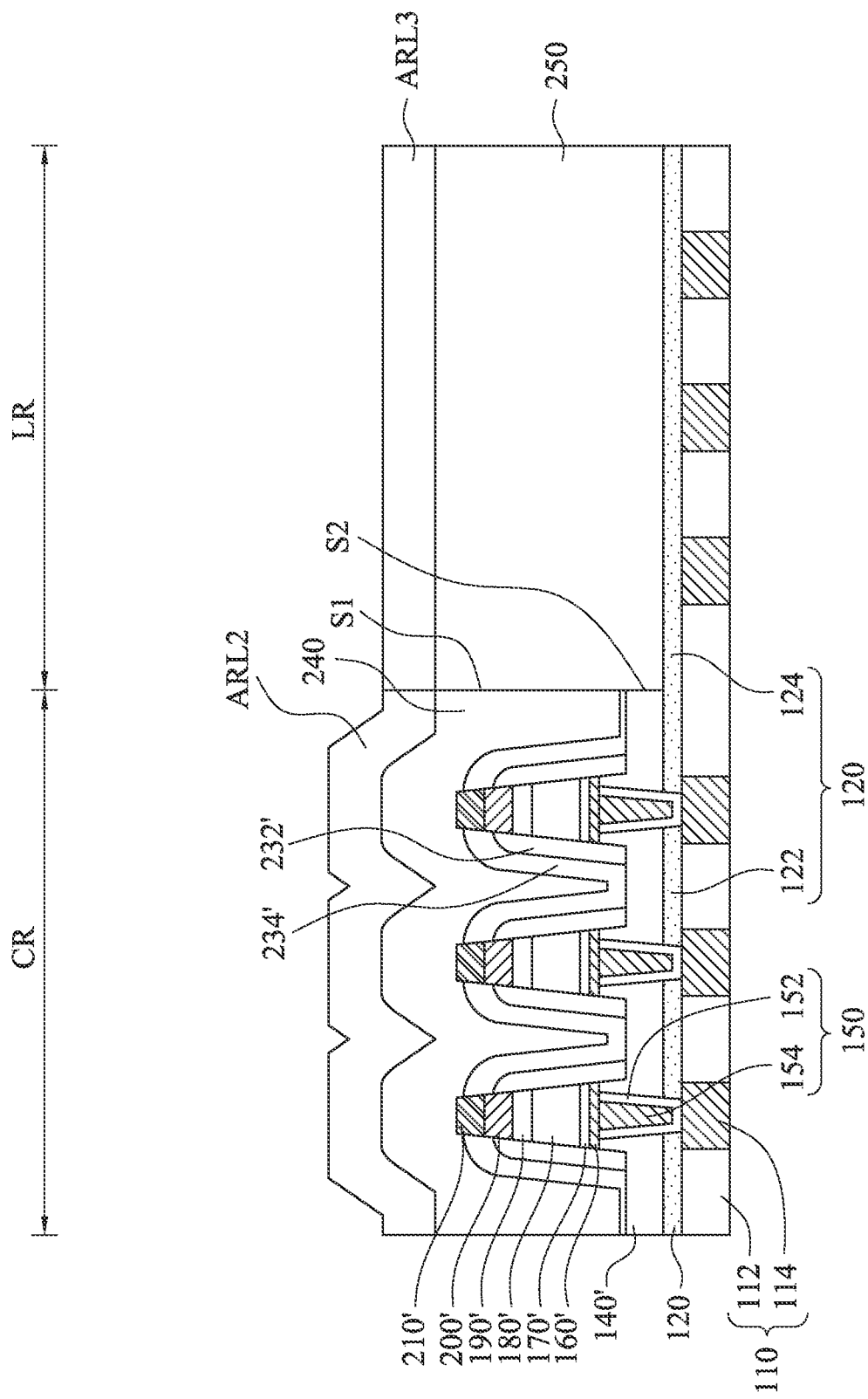

Reference is made to FIG. 14. Another ILD layer 250 is formed over the substrate 110. Since the ILD layers 240 and 250 are formed at different operations, there is a clear interface 51 between the ILD layers 240 and 250. Also, since the ILD layer 250 and the dielectric layer 140 are formed at different operations, there is a clear interface S2 between the ILD layer 250 and the dielectric layer 140.

In some embodiments, the ILD layer 250 may have the same material as the ILD layer 240 or the dielectric layer 140. In some other embodiments, the ILD layer 250 may have a different material than the ILD layer 240 or the dielectric layer 140. In some embodiments, the ILD layer 250 includes silicon oxide, fluorinated silica glass (FSG), carbon doped silicon oxide, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, low-k dielectric material, the like or combinations thereof. An anti-reflection layer ARL3, for example, a nitrogen-free anti-reflection layer (NFARL) is optionally formed over the ILD layer 250.

Figure 15:
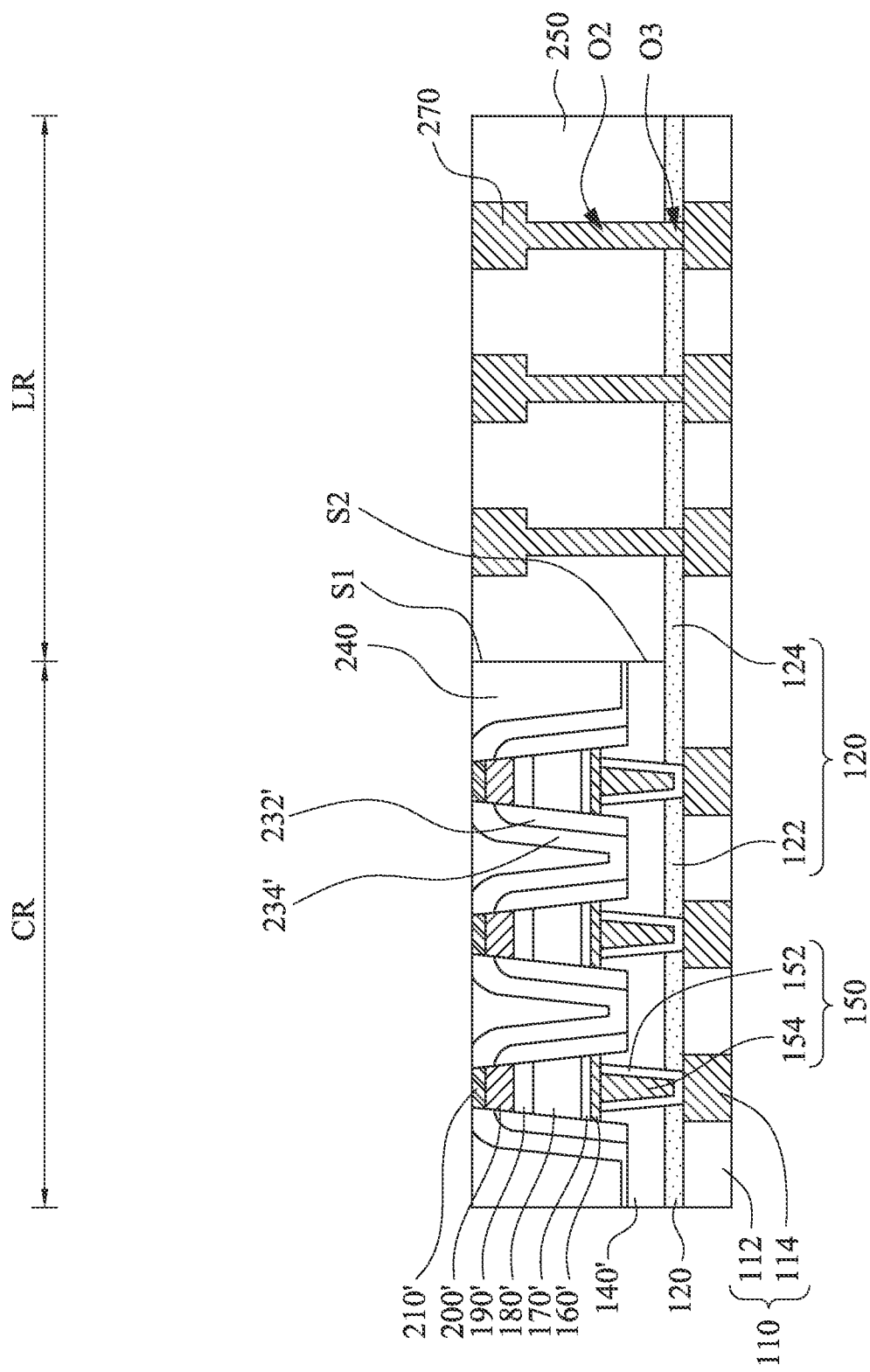

Reference is made to FIG. 15. A metallization pattern 270 is then formed in the ILD layer 250. Formation of the metallization pattern 270 may be formed by etching openings O2 in the ILD layer 250, etching openings O3 in the second portion 124 of the etch stop layer 120, and then filling one or more metals (e.g., copper) in the openings O2 and O3 to form the metallization pattern 270. In some embodiments where the ILD layer 250 is silicon oxide, the etchant used in etching the openings O2 can be dilute hydrofluoric acid (HF), HF vapor, $CF_4$, $C4F_8$, $CH_xF_y$, $C_xF_y$, $SF_6$, or $NF_3$, Ar, $N_2$, $O_2$, Ne, gas. In some embodiments, the etch stop layer 120 may has a higher etch resistance to the etching the openings O2 than that of the ILD layer 250. The etching the openings O2 may stop at the etch stop layer 120 and not damage the underlying ILD layer 112. After the openings O2 and O3 are filled with metals, a planarization is performed to remove an excess portion of the metals outside the openings O2, and therefore the metallization pattern 270 is formed. In some embodiments, portions of the spacers 234' and the top electrodes 210' are also removed by the planarization, and the remaining spacers 234' covers sidewalls of the remaining top electrodes 210' and leaves top surfaces of the remaining top electrodes 210' uncovered. Through the configuration, the metallization pattern 270 can reach and electrically connect the metallization pattern 114.

Figure 16:
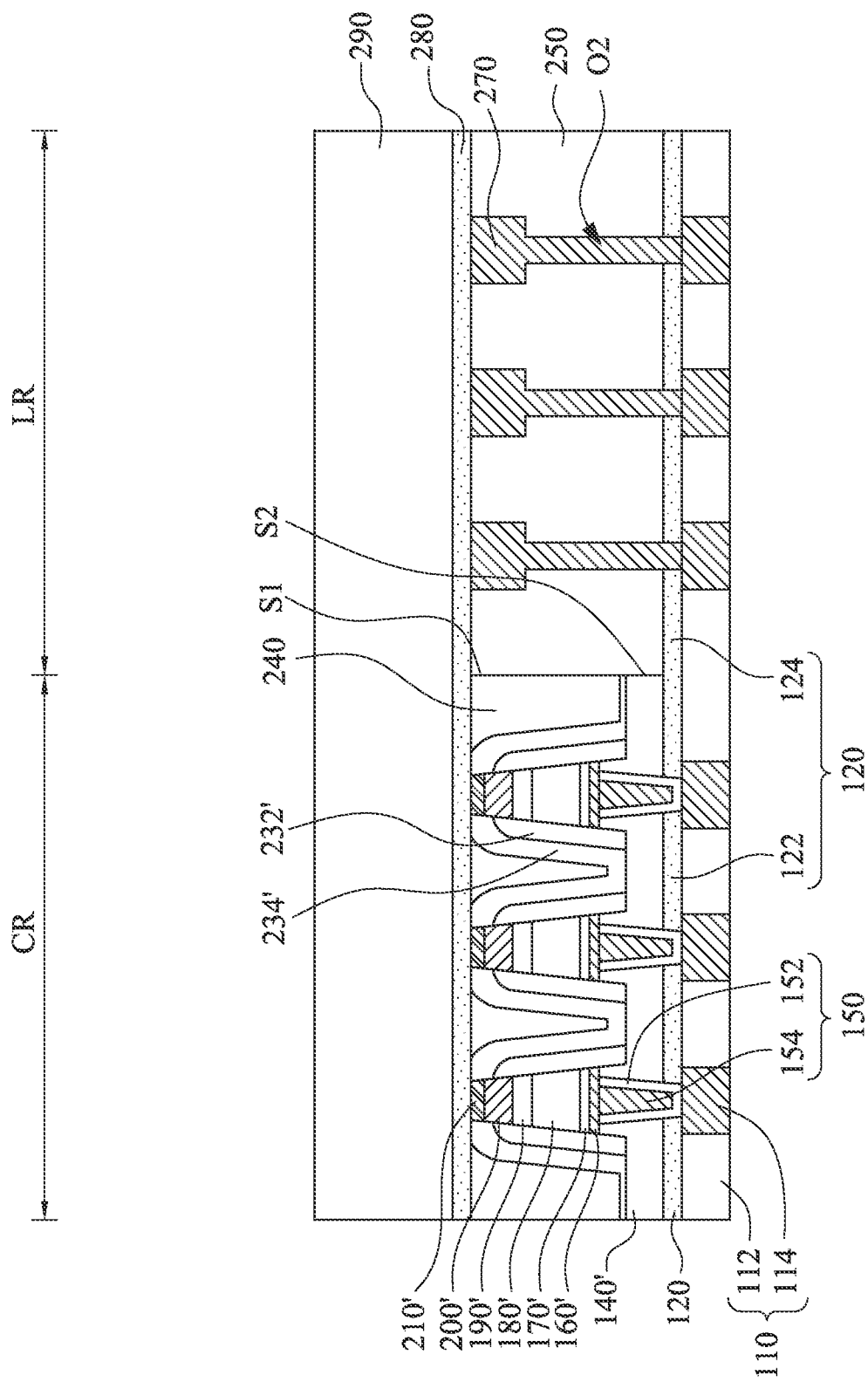

Reference is made to FIG. 16. A etch stop layer 280 and an ILD layer 290 are formed over the resulting structure of FIG. 15. The etch stop layer 280 may have the same material as that of the etch stop layer 120. The etch stop layer 280 may be formed of dielectric material different from the underlying ILD layers 240 and 250. For example, the ILD layers 240 and 250 may be a silicon oxide layer, and the etch stop layer 280 may be a silicon nitride layer or a SiC layer.

In some embodiments, the ILD layer 290 may have the same material as the ILD layers 240 and 250. In some other embodiments, the ILD layer 290 may have a different material than the ILD layers 240 and 250. In some embodiments, the ILD layer 290 includes silicon oxide, fluorinated silica glass (FSG), carbon doped silicon oxide, tetra-ethyl-ortho-silicate (TEOS) oxide, phosphosilic ate glass (PSG), borophosphosilicate glass (BPSG), Black Diamond® (Applied Materials of Santa Clara, Calif.), amorphous fluorinated carbon, low-k dielectric material, the like or combinations thereof.

Figure 17:
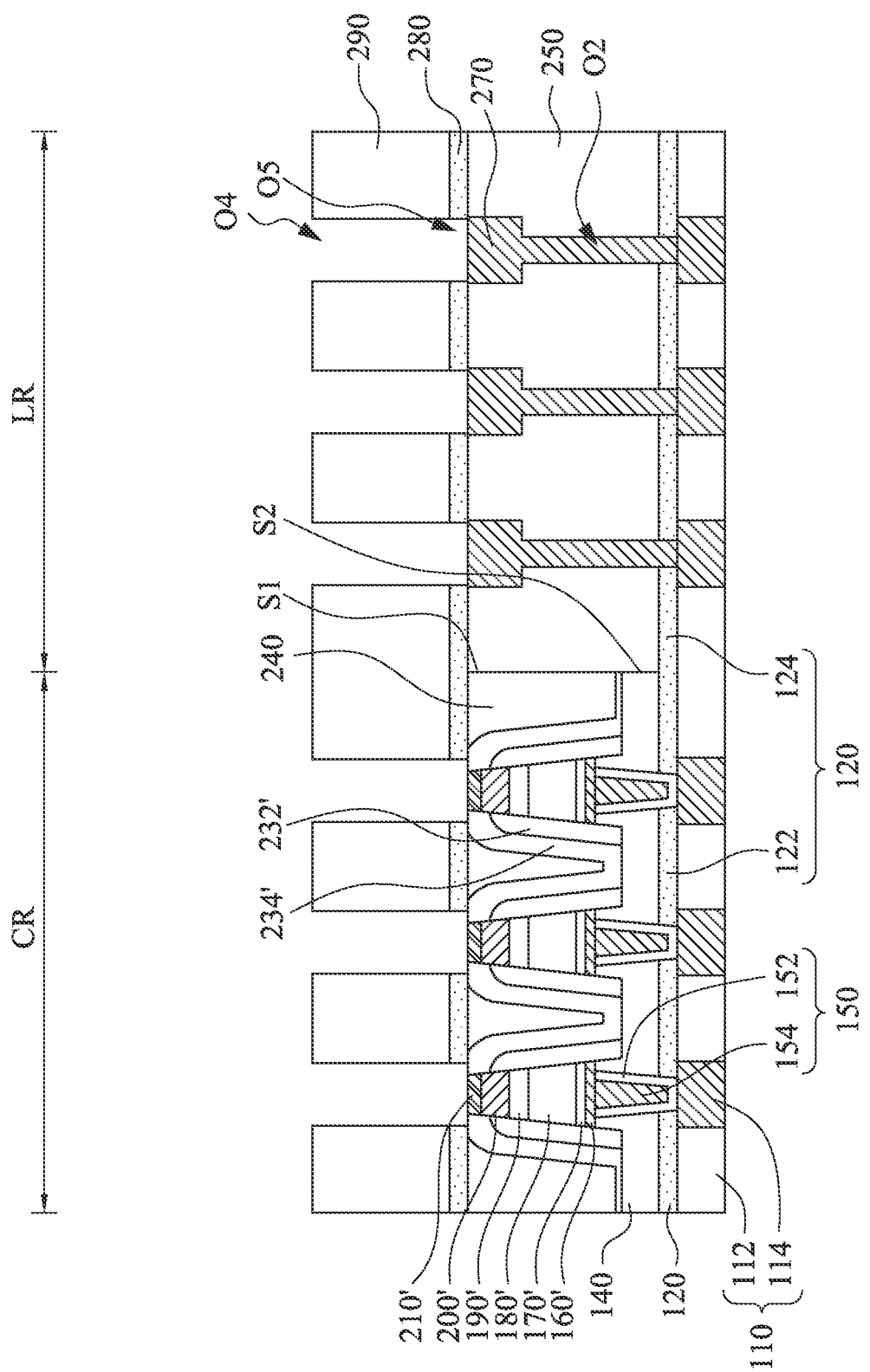

Reference is made to FIG. 17. Holes or openings O4 are etched in the ILD layer 290 by a first etching process, and openings O5 are etched in the etch stop layer 280 by a second etching process. The holes or openings O4 and O5 expose the top surface of the top electrodes 210' in the cell region CR and the metallization pattern 270 in the logic region LR. The etch stop layer 280 has a higher etch resistance to the first etching process than that of the ILD layer 290, such that the first etching process stops at the etch stop layer 280. In some embodiments where the ILD layer 290 is silicon oxide, the etchant used in the first etching process can be dilute hydrofluoric acid (HF), HF vapor, $CF_4$, $C4F_8$, $CH_xF_y$, $C_xF_y$, $SF_6$, or $NF_3$, Ar, $N_2$, $O_2$, He, gas.

In some embodiments, the top electrodes 210' have a higher etch resistance to the second etching process than that of the etch stop layer 280, such that the second etching process stops at the top electrodes 210'. In some embodiments, the spacers 234' has a higher etch resistance to the second etching process than that of the etch stop layer 280 and that of the spacers 232', such that when the holes or openings O4 and O5 are large enough to expose the spacers 234', the second etching process may be stopped by the spacers 234'. For example, in the second etching process, an etch rate of the spacers 234' is slower than that of at least one of the etch stop layer 280 and the spacers 232'. Through the configuration of the spacers 234', the resistance switching elements 180' and the spacers 232' are protected during the second etching process, and the process window of the etching process can be enlarged.

Figure 18:
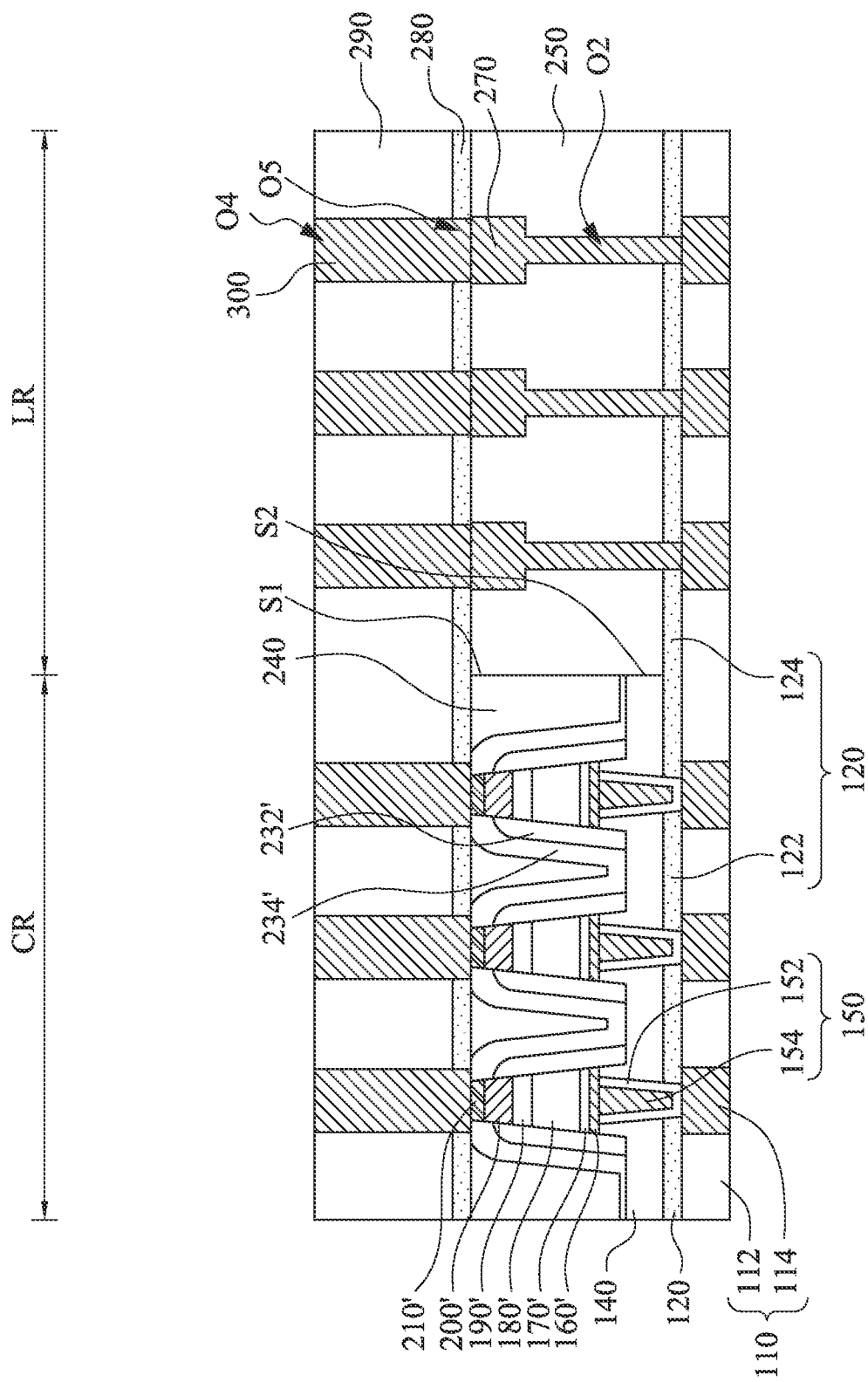

Reference is made to FIG. 18. One or more metals (e.g., copper) in the holes or openings O4 and O5 to form the metallization pattern 300. After the holes or openings O4 and O5 are filled with metals, a planarization is performed to remove an excess portion of the metals outside the holes or openings O4, and therefore the metallization pattern 300 is formed. Through the configuration, the metallization pattern 300 can reach and electrically connect the metallization pattern 270 and the top electrodes 210'.

Figure 19:
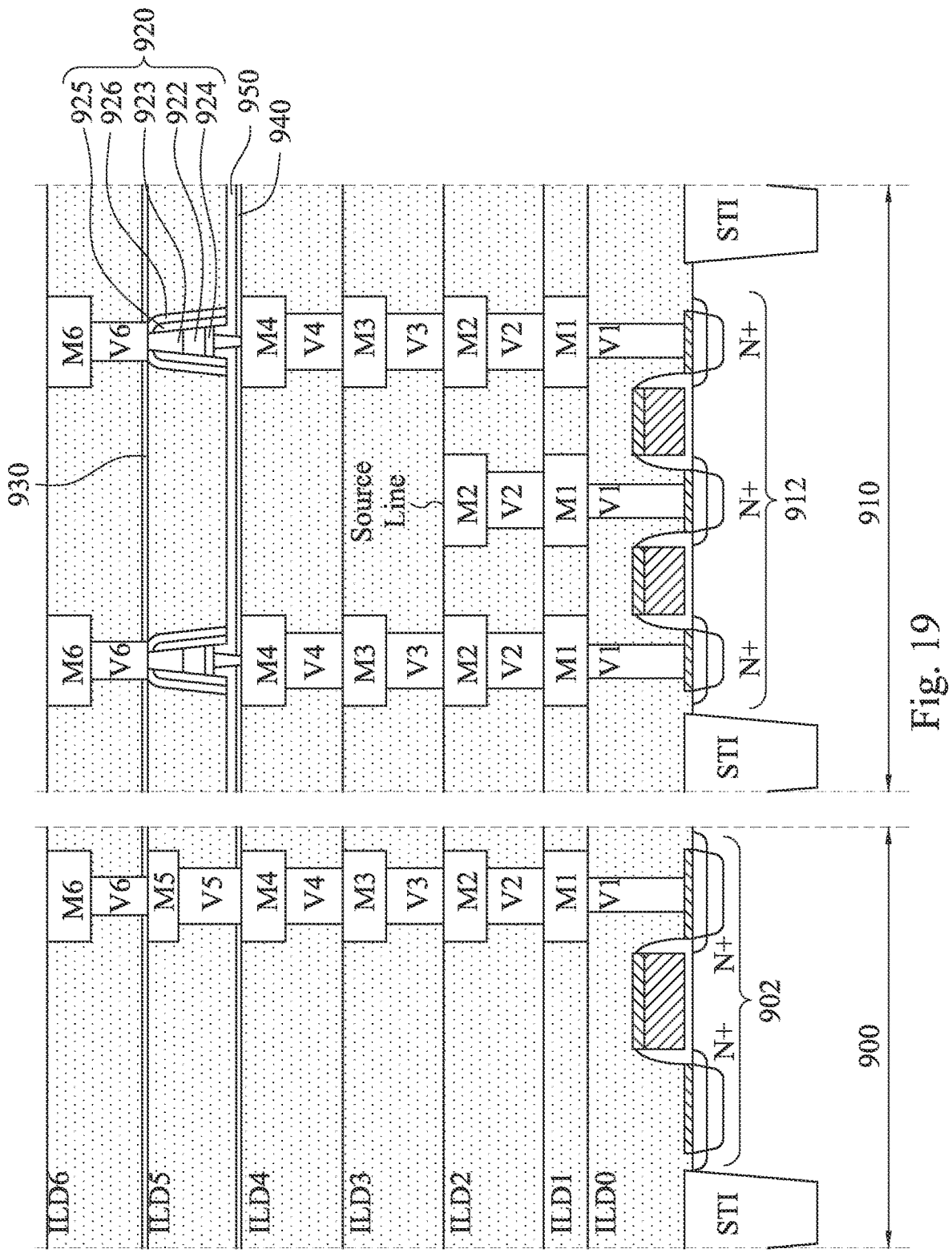
FIG. 19 illustrates an integrated circuit including MRAM devices and logic devices.

FIG. 19 illustrates an integrated circuit including MRAM devices and logic devices. The integrated circuit includes a logic region 900 and a MRAM region 910. Logic region 900 may include circuitry, such as the exemplary transistor 902, for processing information received from MRAM devices 920 in the MRAM region 910 and for controlling reading and writing functions of MRAM devices 920. In some embodiments, the MRAM device 920 includes an MTJ stack 922, a top electrode 923 over the MTJ stack 922, and a bottom electrode 924 under the MTJ stack 922, and spacers 925 and 926 surrounds the top electrode 923, the MTJ stack 922, and the bottom electrode 924.

As depicted, the integrated circuit is fabricated using six metallization layers, labeled as M1 through M6, with six layers of metallization vias or interconnects, labeled as V1 through V6. Other embodiments may contain more or fewer metallization layers and a corresponding more or fewer number of vias. Logic region 900 includes a full metallization stack, including a portion of each of metallization layers M1-M6 connected by interconnects V2-V6, with the interconnect V1 connecting the stack to a source/drain contact of logic transistor 902. The MRAM region 910 includes a full metallization stack connecting MRAM devices 920 to transistors 912 in the MRAM region 910, and a partial metallization stack connecting a source line to transistors 912 in the MRAM region 910. MRAM devices 920 are depicted as being fabricated in between the top of the metallization layer M4 and the bottom of the metallization layer M6. The metallization layer M4 is connected with the bottom electrode 924 through a bottom via in an etch stop layer 940 and a dielectric layer 950, and the metallization layer M6 is connected with the top electrode 923 through the interconnect V6 in an etch stop layer 930. Also included in integrated circuit is a plurality of ILD layers. Seven ILD layers, identified as ILD0 through ILD6 are depicted in FIG. 14 as spanning the logic region 900 and the MRAM region 910. The ILD layers may provide electrical insulation as well as structural support for the various features of the integrated circuit during many fabrication process steps.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the resistance switching element is protected by two spacers from moisture and oxidation. Another advantage is that one of the spacers may have a higher etch resistance to an etching process for metallization pattern, such that the punching trough issue is prevented. Still another advantage is that the process window for the etching process for metallization pattern can be enlarged.

According to some embodiments of the present disclosure, memory device includes a bottom electrode contact, a magnetic tunnel junction pattern, a protection insulating layer, a first capping layer, an interlayer insulating layer, and a second capping layer. The magnetic tunnel junction pattern is over the bottom electrode contact. The protection insulating layer surrounds the magnetic tunnel junction pattern. The first capping layer surrounds the protection insulating layer. The interlayer insulating layer surrounds the first capping layer. The second capping layer is over the first capping layer and the interlayer insulating layer.

According to some embodiments of the present disclosure, an integrated circuit device includes a bottom electrode contact; a magnetic tunnel junction pattern over the bottom electrode contact; a top electrode over the magnetic tunnel junction pattern; a protection insulating layer surrounding the magnetic tunnel junction pattern and the top electrode; a first capping layer surrounding the protection insulating layer; an interlayer insulating layer surrounding the first capping layer; a second capping layer over the first capping layer and the interlayer insulating layer, wherein the first capping layer has a top surface in contact with the second capping layer and a bottom surface in contact with the protection insulating layer; and an upper interconnect layer over the second capping layer, wherein the upper interconnect layer comprises a first upper interconnection line in contact with the top electrode and extending through the second capping layer.

According to some embodiments of the present disclosure, an integrated circuit device includes a substrate comprising a first region and a second region; a bottom electrode contact over the first region of the substrate; a magnetic tunnel junction pattern over the bottom electrode contact; a protection insulating layer covering a side surface of the magnetic tunnel junction pattern; a first capping layer surrounding the protection insulating layer, wherein a top end of the first capping layer is higher than a top end of the protection insulating layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit device, comprising:
   a bottom electrode contact;
   a magnetic tunnel junction pattern over the bottom electrode contact;
   a protection insulating layer surrounding the magnetic tunnel junction pattern;
   a first capping layer surrounding the protection insulating layer;
   an interlayer insulating layer surrounding the first capping layer; and
   a second capping layer over the first capping layer and the interlayer insulating layer.

2. The integrated circuit device of claim 1, wherein the first capping layer is in contact with the protection insulating layer.

3. The integrated circuit device of claim 1, wherein the first capping layer is in contact with the second capping layer.

4. The integrated circuit device of claim 1, wherein the first capping layer spaces the second capping layer from the protection insulating layer.

5. The integrated circuit device of claim 1, further comprising:
   a top electrode over the magnetic tunnel junction pattern; and
   an interconnection line over the top electrode and surrounded by the second capping layer.

6. The integrated circuit device of claim 5, wherein the interconnection line is in contact with the first capping layer.

7. The integrated circuit device of claim 1, wherein the first capping layer further surrounds the magnetic tunnel junction pattern.

8. The integrated circuit device of claim 1, wherein the first capping layer is a silicon nitride layer.

9. The integrated circuit device of claim 1, wherein the protection insulating layer is a silicon nitride layer.

10. An integrated circuit device, comprising:
    a bottom electrode contact;
    a magnetic tunnel junction pattern over the bottom electrode contact;
    a top electrode over the magnetic tunnel junction pattern;
    a protection insulating layer surrounding the magnetic tunnel junction pattern and the top electrode;
    a first capping layer surrounding the protection insulating layer;
    an interlayer insulating layer surrounding the first capping layer;
    a second capping layer over the first capping layer and the interlayer insulating layer, wherein the first capping layer has a top surface in contact with the second capping layer and a bottom surface in contact with the protection insulating layer; and
    an upper interconnect layer over the second capping layer, wherein the upper interconnect layer comprises a first upper interconnection line in contact with the top electrode and extending through the second capping layer.

11. The integrated circuit device of claim 10, wherein the protection insulating layer is in contact with the magnetic tunnel junction pattern and the top electrode.

12. The integrated circuit device of claim 10, further comprising:
   a lower interconnect layer comprising a first lower interconnection line in a memory region and a second lower interconnection line in a logic region, wherein the bottom electrode contact is over the first lower interconnection line; and
   a conductive pattern over the second lower interconnection line.

13. The integrated circuit device of claim 12, wherein the conductive pattern is spaced apart from the first capping layer.

14. The integrated circuit device of claim 12, wherein the upper interconnect layer further comprises a second upper interconnection line in contact with the conductive pattern and extending through the second capping layer.

15. An integrated circuit device, comprising:
   a substrate comprising a first region and a second region;
   a bottom electrode contact over the first region of the substrate;
   a magnetic tunnel junction pattern over the bottom electrode contact;
   a protection insulating layer covering a side surface of the magnetic tunnel junction pattern; and
   a first capping layer surrounding the protection insulating layer, wherein a top end of the first capping layer is higher than a top end of the protection insulating layer.

16. The integrated circuit device of claim 15, wherein a bottom surface of the first capping layer is lower than the top end of the protection insulating layer.

17. The integrated circuit device of claim 15, further comprising:
   a top electrode over the magnetic tunnel junction pattern, wherein the protection insulating layer is further on a side surface of the top electrode.

18. The integrated circuit device of claim 15, further comprising:
   a dielectric layer surrounding the bottom electrode contact; and
   a bottom electrode between the bottom electrode contact and the magnetic tunnel junction pattern, wherein the bottom electrode is in contact with a top surface of the dielectric layer and a top surface of the bottom electrode contact.

19. The integrated circuit device of claim 18, wherein the protection insulating layer is in contact with the dielectric layer.

20. The integrated circuit device of claim 15, wherein a bottom surface of the protection insulating layer is below a top surface of the bottom electrode contact.

* * * * *